(12) United States Patent
Kim

(10) Patent No.: US 9,035,549 B2
(45) Date of Patent: May 19, 2015

(54) LIGHT EMITTING DEVICE PACKAGE AND LIGHT EMITTING MODULE

(75) Inventor: Jun Hyoung Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 143 days.

(21) Appl. No.: 13/234,747

(22) Filed: Sep. 16, 2011

(65) Prior Publication Data
US 2012/0001538 A1     Jan. 5, 2012

(30) Foreign Application Priority Data

Sep. 20, 2010  (KR) .................. 10-2010-0092484

(51) Int. Cl.
| H01J 1/62 | (2006.01) |
| H01L 25/075 | (2006.01) |
| F21K 99/00 | (2010.01) |
| F21V 29/00 | (2006.01) |
| F21Y 101/02 | (2006.01) |
| H01L 33/50 | (2010.01) |
| F21V 8/00 | (2006.01) |

(52) U.S. Cl.
CPC ............ *H01L 25/0753* (2013.01); *F21K 9/137* (2013.01); *F21V 29/2231* (2013.01); *F21Y 2101/02* (2013.01); *H01L 33/507* (2013.01); *H01L 2924/09701* (2013.01); *G02B 6/0021* (2013.01); *G02B 6/0068* (2013.01); *G02B 6/0073* (2013.01); *G02B 6/0091* (2013.01); *H01L 2224/48091* (2013.01); *H01L 2224/73265* (2013.01)

(58) Field of Classification Search
CPC .................. H01L 2224/48091; F21V 29/2231
USPC ...................................... 313/504; 362/217.09
See application file for complete search history.

(56) References Cited

U.S. PATENT DOCUMENTS

| 2005/0093430 A1* | 5/2005 | Ibbetson et al. ............... 313/501 |
| 2008/0094829 A1* | 4/2008 | Narendran et al. ........... 362/231 |
| 2010/0165600 A1* | 7/2010 | Ku .................................. 362/84 |

FOREIGN PATENT DOCUMENTS

| JP | 2007-080880 | 3/2007 |
| JP | 2008-507095 | 3/2008 |
| JP | 2009-224656 | 10/2009 |

OTHER PUBLICATIONS

Machine translation of JP 2009-224656.*

* cited by examiner

*Primary Examiner* — Anne Hines
*Assistant Examiner* — Jacob R Stern
(74) *Attorney, Agent, or Firm* — Lowe Hauptman & Ham, LLP

(57) ABSTRACT

A light emitting device package is disclosed. The light emitting device package includes a package body, at least one light emitting diode disposed on the package body, a molding layer surrounding the light emitting diode, and a phosphor layer provided on the package body, wherein the phosphor layer extends upward from surface of the package body.

20 Claims, 10 Drawing Sheets

LIGHT EMITTING DEVICE PACKAGE AND LIGHT EMITTING MODULE

CROSS REFERENCE TO RELATED APPLICATION

This application claims priority of under 35 U.S.C. §119 to Korean Patent Application No. 10-2010-0092484, filed in Korea on 20 Sep., 2010, which is hereby incorporated in its entirety by reference as if fully set forth herein.

TECHNICAL FIELD

Embodiments relate to a light emitting device package and a light emitting module.

BACKGROUND

With advance of metal organic chemical vapor deposition or molecular beam growth of gallium nitride (GaN), red, green and blue light emitting diodes (LEDs) capable of realizing high brightness and white light have been developed.

Such LEDs do not contain environmentally harmful materials, such as mercury, used in existing lighting equipment, such as glow lamps and fluorescent lamps and thus exhibits excellent environmentally friendly property, long lifespan and low power consumption. For this reason, the LEDs are replacing existing light sources. A core competition factor of such LED devices is realization of high brightness based on high-efficiency and high-power chip and packaging technology.

SUMMARY

The embodiments are directed to a light emitting device package and a light emitting module that substantially obviate one or more problems due to limitations and disadvantages of the related art.

The light emitting device package and a light emitting module, which are capable of improving light extraction efficiency.

The light emitting device package includes a package body, at least one light emitting diode disposed on the package body, a molding layer surrounding the light emitting diode, and a phosphor layer provided on package body, wherein the phosphor layer extends upward from a surface of the package body.

The package body may be flat or may have a cavity.

The package body may be provided with a first sloped part having a first slope and a second sloped part having a second slope. A first light emitting diode may be disposed on the first slope and a second light emitting diode may be disposed on the second slope, wherein the phosphor layer disposes between the first light emitting diode and the second light emitting diode. The phosphor layer may be perpendicular to the surface of the package body.

The first sloped part and the second sloped part may protrude from the package body. Alternatively, the first sloped part and the second sloped part may be depressed in the package body.

The first sloped part and the second sloped part may be made of the same material as the package body and integrated with the packaged body.

The first light emitting diode and the second light emitting diode may be symmetric with respect to at least a portion of the phosphor layer.

The first sloped part and the second sloped part may be symmetric with respect to at least a portion of the phosphor layer.

The light emitting device package may further include a first conductive layer disposed between the first slope and the first light emitting diode and a second conductive layer disposed between the second slope and the second light emitting diode.

The package body may have a cavity, a sidewall of the cavity being sloped at a predetermined tilt with respect to a bottom of the cavity, and the first light emitting diode and the second light emitting diode may be disposed on the sidewall of the cavity.

The light emitting device package may further include a reflection layer disposed between the sidewall of the cavity and the first light emitting diode.

The phosphor layer may have a first light incidence surface and a second light incidence surface. The first light emitting diode may face the first light incidence surface and the second light emitting diode may face the second light incidence surface.

In another aspect of the embodiments, a light emitting module includes a board, first light emitting diodes and second light emitting diodes disposed on the board, a molding layer disposed on the board to surround the first light emitting diodes and the second light emitting diodes, and a phosphor layer provided in the molding layer, wherein the phosphor layer extends upward from top surface of the board, wherein the first light emitting diodes and the second light emitting diodes are opposite to each other around the phosphor layer.

The first light emitting diodes and the second light emitting diodes may be symmetric with respect to at least a portion of the phosphor layer.

The phosphor layer may have a first light incidence surface and a second light incidence surface. The first light emitting diodes may face the first light incidence surface and the second light emitting diodes may face the second light incidence surface.

The light emitting module may further include first sloped parts disposed on the board, wherein the first sloped parts are separated from each other and second sloped parts disposed on the board corresponding to the first sloped parts. Each of the first light emitting diodes may be disposed on a corresponding one of the first sloped parts and each of the second light emitting diodes may be disposed on a corresponding one of the second sloped parts.

The light emitting module may further include a first sloped part having a first slope tilted from the board and a second sloped part separated from the first sloped part with a second slope tilted from the board. The first light emitting diodes may be disposed on the first slope and separated from each other and the second light emitting diodes may be disposed on the second slope and separated from each other.

The molding layer may be disposed to simultaneously surround the first light emitting diodes, the second light emitting diodes and a region of the board located between the first light emitting diodes and the second light emitting diodes.

In another aspect of embodiments, A light apparatus includes a power coupler to supply power, a heat sink connected to the power coupler, a light emitting module fixed to the heat sink, and a reflector connected to a lower end of the heat sink to reflect light emitted from the light emitting module, wherein the light emitting module is the above embodiment.

It is to be understood that both the foregoing general description and the following detailed description of the embodiments are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF THE SPECIFIC EMBODIMENTS

Figure 1:
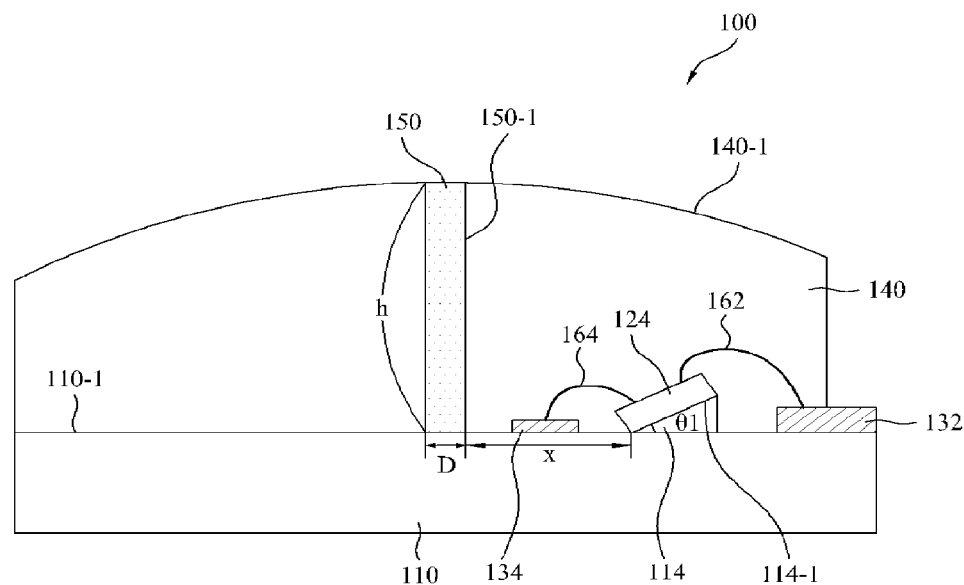
FIG. 1 is a view showing a light emitting device package according to an embodiment.

Reference will now be made in detail to the preferred embodiments of the present invention, examples of which are illustrated in the accompanying drawings.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

In the drawings, sizes are exaggerated, omitted, or schematically illustrated for convenience and clarity of description. Further, sizes of elements do not denote actual sizes thereof. Wherever possible, the same reference numbers will be used throughout the drawings to refer to the same or like parts. Hereinafter, light emitting device packages and light emitting modules according to embodiments will be described with reference to the accompanying drawings.

FIG. 1 is a view showing a light emitting device package 100 according to an embodiment. Referring to FIG. 1, the light emitting device package 100 includes a package body 110, a first conductive layer 132, a second conductive layer 134, a first light emitting device 124, a molding layer 140, a phosphor layer 150, a first wire 162 and a second wire 164.

The package body 110 may be flat, to which, however, embodiments are not limited.

The package body 110 may be made of at least one selected from among resin, such as polyphthalamide (PPA), silicon (Si), ceramic, metal, photo sensitive glass (PSG), sapphire ($Al_2O_3$) and a printed circuit board (PCB). The first conductive layer 132 and the second conductive layer 134 are disposed on the package body 110 so as to be separated from each other.

The package body 110 is provided with a first sloped part 114 having a slope 114-1 on which the first light emitting device 124 is mounted. The first light emitting device may include a light emitting diode. The first sloped part 114 may protrude from the package body 110. A tilt θ1 of the slope 114-1 of the first sloped part 114 may be greater than 0° and less than 90° (0°<θ1<90°). The tilt θ1 of the slope 114-1 may be an angle between the slope 114-1 and the package body 110. The first sloped part 114 may be made of the same material as the package body 110 and may be integrated with the packaged body 110.

The first light emitting device 124 is disposed on the slope 114-1 of the first sloped part 114. The molding layer 140 surrounds the first light emitting device 124 disposed on the first sloped part 114. The molding layer 140 may be made of a transparent polymer resin, such as epoxy or silicon.

The phosphor layer 150 is provided on the package body. The phosphor layer 150 is located in the molding layer at one side of the first light emitting device 124 to change the wavelength of light emitted from the first light emitting device 124. The phosphor layer 150 extends upward from the top surface of the package body 110 in the molding layer 140. Here, the upward direction is a direction from the bottom of the package body 110 to a top surface 140-1 of the molding layer 140.

Namely, the phosphor layer 150 provided in the molding layer 140 tilts with respect to the package body 110. For example, the phosphor layer 150 may be perpendicular to a top surface 110-1 of the packaged body 110. A light incidence surface 150-1 of the phosphor layer 150 will be described in detail with reference to FIG. 10.

The phosphor layer 150 may be formed by mixing a resin layer with phosphor powder. The phosphor powder may include at least one selected from among red, yellow and green phosphor powder. Alternatively, the phosphor layer 150 may be formed by inserting a phosphor film into the molding layer 140.

The first light emitting device 124 is electrically connected to the first conductive layer 132 via the first wire 162 and is electrically connected to the second conductive layer 134 via the second wire 164.

In the light emitting device package 100 according to this embodiment, the first light emitting device 124 is at a predetermined angle to the package body 110 and the phosphor layer 150 tilts in the molding layer 140. Consequently, light transmitted through the phosphor layer 150 and light reflected by the phosphor layer 150 do not travel toward the first light emitting device 124 and the package body 110.

For example, since the phosphor layer 150 is perpendicular to the top surface 110-1 of the packaged body 110, light transmitted through the phosphor layer 150 and light reflected by the phosphor layer 150 are prevented from traveling toward the first light emitting device 124 and the package body 110.

As a result, the transmitted light and the reflected light are absorbed or reflected by the first light emitting device 124 or the package body 110 and thus are not extinguished. Consequently, the transmitted light and the reflected light are effectively extracted from the light emitting device package 100, thereby improving light extraction efficiency. The transmitted light and the reflected light will be described in detail with reference to FIG. 11.

Figure 14:
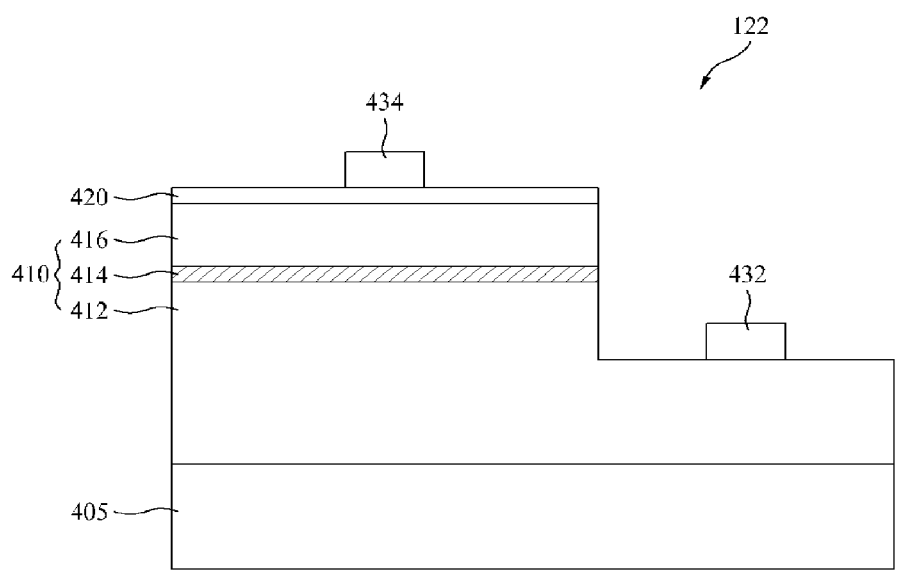
FIG. 14 is a view showing an embodiment of a light emitting device included in the light emitting device package shown in FIG. 1.

FIG. 14 is a view showing an embodiment of a light emitting device 122 included in the light emitting device package 100 shown in FIG. 1. Referring to FIG. 14, the light emitting device 122 may include a substrate 405, a light emitting structure 410, a conductive layer 420, a first electrode 432 and a second electrode 434.

The substrate 405 may be any one selected from among a sapphire substrate, a silicon (Si) substrate, a zinc oxide (ZnO) substrate and a nitride semiconductor substrate or a template substrate on which at least one selected from among GaN, InGaN, AlGaN and AlInGaN is stacked.

The light emitting structure 410 includes a first conductive semiconductor layer 412, an active layer 414 and a second conductive semiconductor layer 416 sequentially stacked on the substrate 405. In this case, a buffer layer (not shown) and/or an undoped nitride layer (not shown) may be disposed to reduce lattice constant difference between the substrate 405 and the light emitting structure 410.

The first conductive semiconductor layer 412 and the second conductive semiconductor layer 416 may be nitride-based semiconductor layer selected from among, for example, InAlGaN, GaN, AlGaN, InGaN, AlN and InN. The first conductive semiconductor layer 412 may be doped with a first conductive dopant (for example, Si, Ge or Sn) and the second conductive semiconductor layer 416 may be doped with a second conductive dopant (for example, Mg or Zn).

The active layer 414 may be formed to have a single or multiple quantum well structure. For example, the active layer 414 may be formed of a GaN-based material, such as GaN or InGaN, to have a single or multiple quantum well structure.

In the light emitting structure 410, the second conductive semiconductor layer 416, the active layer 414 and the first conductive semiconductor layer 412 are partially etched to expose a portion of the first conductive semiconductor layer 412.

The conductive layer 420 is formed on the light emitting structure 410, for example the second conductive semiconductor layer 416. The conductive layer 420 reduces total reflection and exhibits high transmissivity, thereby improving extraction efficiency of light emitted from the active layer 414 to the second conductive semiconductor layer 416. The conductive layer 420 may be made of a transparent oxide-based material exhibiting high transmissivity with respect to emission wavelength of the light emitting device 122. For example, the transparent oxide-based material may include indium tin oxide (ITO), tin oxide (TO), indium zinc oxide (IZO), indium tin zinc oxide (ITZO) and zinc oxide (ZnO).

The first electrode 432 is formed on the exposed first conductive semiconductor layer 412. The second electrode 434 is disposed on the conductive layer 420.

The substrate 405 of the light emitting device 122 may be fixed to the slope 114-1 of the first sloped part 114. The first electrode 432 may be connected to the first conductive layer 132 via the first wire 162 and the second electrode 434 may be connected to the second conductive layer 134 via the second wire 164.

Figure 2:
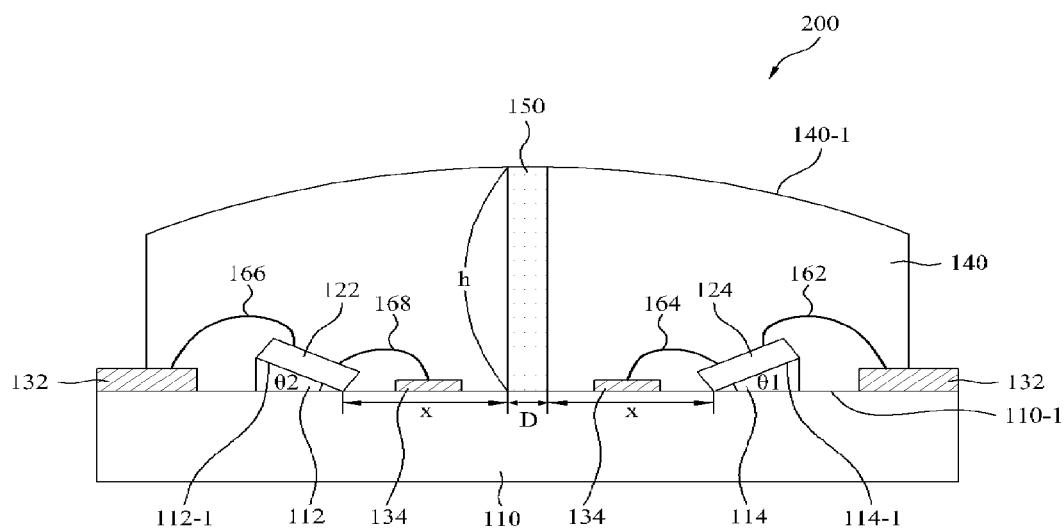
FIG. 2 is a view showing a light emitting device package according to another embodiment.

FIG. 2 is a view showing a light emitting device package 200 according to another embodiment. Parts of FIG. 2 identical to those of FIG. 1 are denoted by the same reference numerals and a description thereof will thus be omitted or briefly described.

Referring to FIG. 2, the light emitting device package 200 includes a package body 110, a first conductive layer 132, a second conductive layer 134, a first light emitting device 124, a second light emitting device 122, a molding layer 140, a phosphor layer 150 and first to fourth wires 162 to 168.

The first light emitting device 124 and the second light emitting device 122 are disposed on the package body 110 so as to be tilted. The first light emitting device and the second light emitting device may include a light emitting diode. The light emitting device package 200 further includes a second sloped part 112 having a slope 112-1 on which the second light emitting device 122 is mounted as compared with the light emitting device package 100 shown in FIG. 1.

The second sloped part 112 is provided at the package body 110 so that the second sloped part 112 is separated from the first sloped part 114. The second sloped part 112 may protrude from the package body 110. The second sloped part 112 may be made of the same material as the package body 110 and may be integrated with the packaged body 110.

A tilt θ2 of the slope 112-1 of the second sloped part 112 may be greater than 0° and less than 90° (0°<θ1<90°. The tilt θ2 of the slope 112-1 may be an angle between the slope 112-1 and the package body 110.

The second light emitting device 122 is disposed on the slope 112-1 of the second sloped part 112. In this case, the slope 114-1 of the first sloped part 114 and the slope 112-1 of the second sloped part 112 may be symmetric with respect to at least a portion of the phosphor layer 150, to which, however, embodiments are not limited.

The molding layer 140 surrounds the first light emitting device 124 disposed on the first sloped part 114 and the second light emitting device 122 disposed on the second sloped part 112. For example, the molding layer 140 may be disposed to simultaneously surround the first light emitting device 124, the second light emitting device 122, a top surface 110-1 of the package body 110 located between the first light emitting device 124 and the second light emitting device 122, and the wires 162 to 168.

The phosphor layer 150 may be provided in the molding layer 140 so that the phosphor layer 150 extends upward from the top surface of the package body 110. The phosphor layer 150 extends upward from the top surface of the package body.

The first light emitting device 124 and the second light emitting device 122 may be disposed so that the first light emitting device 124 and the second light emitting device 122 are opposite to each other around the phosphor layer 150. The first light emitting device 124 may be disposed at one side of the phosphor 150 and the second light emitting device 122 may be disposed at the other side of the phosphor layer 150. The one side is the opposite of the other side with respect to the phosphor layer 150.

For example, the first light emitting device 124 may be disposed at one side (for example, the right side) of the phosphor layer 150 and the second light emitting device 122 may be disposed at the other side (for example, left side) of the phosphor layer 150.

The first sloped part 114 and the second sloped part 112 may be symmetric with respect to the phosphor layer 150 or at least a portion of the phosphor layer 150. Consequently, the first light emitting device 124 and the second light emitting device 122 may be symmetric with respect to the phosphor layer 150 or at least a portion of the phosphor layer 150.

For example, the first light emitting device 124 and the second light emitting device 122 may be separated from the phosphor layer 150 or at least a portion of the phosphor layer 150 by the same distance x, to which, however, embodiments are not limited. Also, the first light emitting device 124 and the second light emitting device 122 may have the same tilt with respect to the phosphor layer 150 or at least a portion of the phosphor layer 150. For example, θ1 may be equal to θ2, to which, however, embodiments are not limited.

The second light emitting device 122 is electrically connected to the first conductive layer 132 via the third wire 166 and is electrically connected to the second conductive layer 134 via the fourth wire 168.

In the light emitting device package 200, transmitted light and reflected light are effectively extracted from the light emitting device package 200, thereby improving light extraction efficiency. Also, in the light emitting device package 200 shown in FIG. 2, the light emitting device are symmetric with respect to the phosphor layer 150, thereby achieving uniform light emission. In addition, the phosphor layer 150 is provided in only a portion of the molding layer 140, thereby saving phosphor and thus reducing manufacturing cost.

Figure 3:
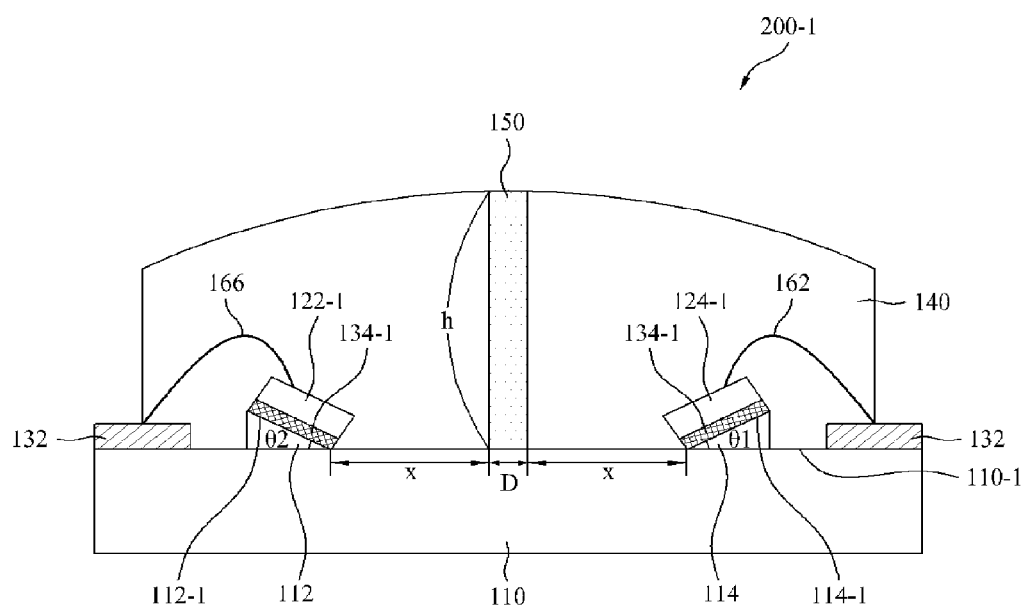
FIG. 3 is a view showing a light emitting device package according to another embodiment.

FIG. 3 is a view showing a light emitting device package 200-1 according to another embodiment. Parts of FIG. 3 identical to those of FIG. 2 are denoted by the same reference numerals and a description thereof will thus be omitted or briefly described.

Unlike the embodiment shown in FIG. 2, the light emitting device package 200-1 includes vertical type light emitting devices 122-1 and 124-1. Second conductive layers 134-1 are disposed on a first sloped part 114 and a second sloped part 112. The first light emitting device 124-1 may be disposed on the second conductive layer 134-1 on the first sloped part 114 and the second light emitting device 122-1 may be disposed on the second conductive layer 134-1 on the second sloped part 112.

Figure 15:
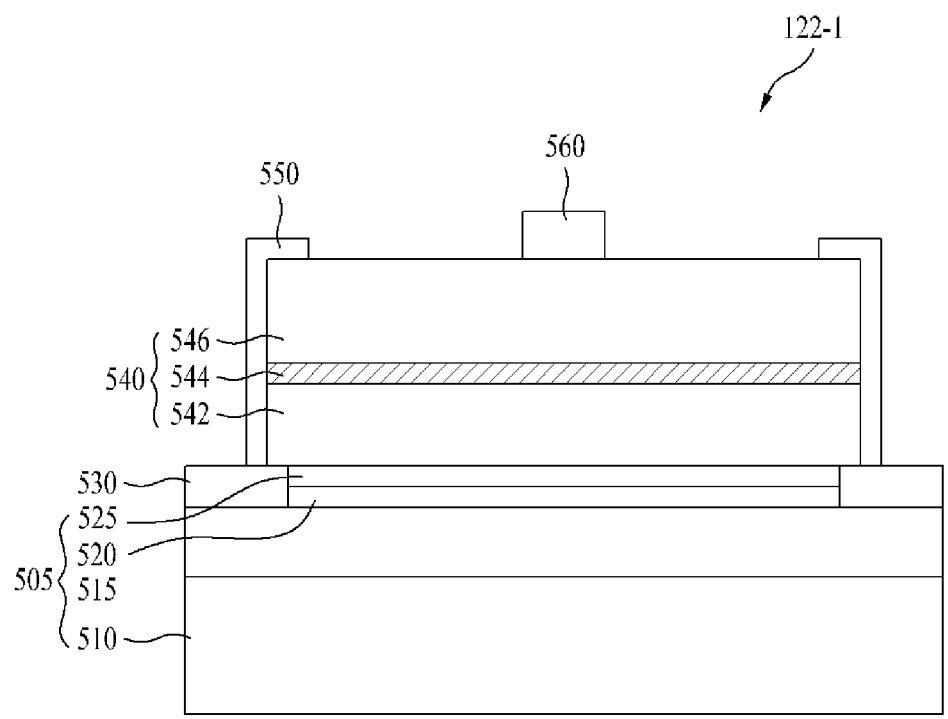
FIG. 15 is a view showing an embodiment of a light emitting device included in the light emitting device package shown in FIG. 3.

FIG. 15 is a view showing an embodiment of the light emitting device 124-1 included in the light emitting device package 200-1 shown in FIG. 3. Referring to FIG. 15, the light emitting device 124-1 may include a second electrode layer 505, a protective layer 530, a light emitting structure 540, a passivation layer 550 and a first electrode 560.

The second electrode layer 505 includes a support substrate 510, an adhesion layer 515, a reflective layer 520 and an ohmic layer 525. The second electrode layer 505 may be bonded to the second conductive layer 134-1 disposed on the first sloped part 114 shown in FIG. 3.

The support substrate 510 is conductive and may include at least one selected from among, for example, copper (Cu), gold (Au), nickel (Ni), molybdenum (Mo), copper-tungsten (Cu—W) and a carrier wafer (for example, Si, Ge, GaAs, ZnO or SiC).

The adhesion layer 515 is formed on the support substrate 510. The adhesion layer 515 is formed under the reflective layer 520 to join the support substrate 510 in a bonding fashion. The adhesion layer 515 include barrier metal or bonding metal and may include, for example, at least one selected from among Ti, Au, Sn, Ni, Cr, Ga, In, Bi, Cu, Ag and Ta.

The reflective layer 520 is formed on the adhesion layer 515 to reflect light incident from the light emitting structure 540, thereby improving light extraction efficiency. The reflective layer 520 may be made of metal or metal alloys including at least one selected from among, for example, Ag, Ni, Al, Rh, Pd, Ir, Ru, Mg, Zn, Pt, Au and Hf.

The ohmic layer 525 is formed on the reflective layer 520. The ohmic layer 525 is in ohmic contact with the second conductive semiconductor layer 542 so that power is smoothly supplied to the light emitting structure 540. The ohmic layer 525 may include at least one selected from, for example, ITO, IZO, IZTO, IAZO, IGZO, IGTO, AZO and ATO.

A current blocking layer (not shown) may be disposed between the ohmic layer 525 and the second conductive semiconductor layer 542 to reduce a phenomenon in which current concentrates on the shortest distance between the first electrode 560 and the support substrate 510 and thus improve light emission efficiency of the light emitting device 124-1.

The protective layer 530 is disposed around the adhesion layer 515 in a unit chip region to reduce a phenomenon in which the light emitting structure 540 and the adhesion layer 515 are separated from each other, and therefore, reliability of the light emitting device 124-1 lowered.

The light emitting structure 540 is formed on the second electrode layer 505. The light emitting structure 540 may include a compound semiconductor layer having a plurality of third to fifth family elements. The light emitting structure 540 may include a second conductive semiconductor layer 542, an active layer 544 and a first conductive semiconductor layer 546 sequentially stacked on the second electrode layer 505.

The passivation layer 550 is formed on a lateral surface of the light emitting structure 540. The passivation layer 550 may be formed to electrically protect the light emitting structure 540. The passivation layer 550 may be made of, for example, $SiO_2$, $SiO_x$, $SiO_xN_y$, $Si_3N_4$ or $Al_2O_2$, to which, however, embodiments are not limited.

A roughness pattern (not shown) may be formed at the top surface of the first conductive semiconductor layer 546 to improve light extraction efficiency. The first electrode 560 is formed to contact the top surface of the light emitting structure 540. The first electrode 560 may be electrically connected to the first conductive layer 132 via a wire 162.

Figure 4:
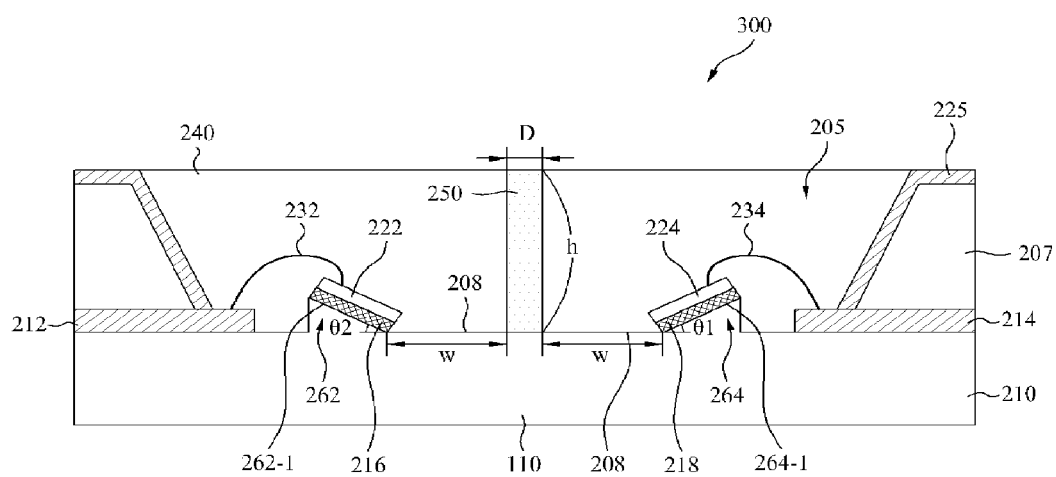
FIG. 4 is a view showing a light emitting device package according to another embodiment.

FIG. 4 is a view showing a light emitting device package 300 according to another embodiment. Referring to FIG. 4, the light emitting device package 300 includes a package body 210, first to fourth conductive layers 212 to 218, a first light emitting device 222, a second light emitting device 224, a reflection plate 225, a first wire 232, a second wire 234, a molding layer 240 and a phosphor layer 250.

The package body 210 is provided at a region thereof with a cavity 205 having a sidewall 207 and a bottom 208. In this case, the sidewall 207 of the cavity 205 may be sloped.

The package body 210 may be formed of a substrate, exhibiting high insulation and heat conductivity, made of resin, such as polyphthalamide (PPA), silicon, ceramic, silicon carbide (SiC) or aluminum nitride (AlN). Alternatively, a plurality of substrates may be stacked to constitute the package body 110. Also, the cavity 205 may be formed by etching the substrate. However, embodiments are not limited to the aforementioned material, structure and shape of the package body.

The first to fourth conductive layers 212 to 218 may be disposed at the surface of the package body 210 so as to be electrically separated from each other in consideration of heat dissipation or installation of the light emitting devices 222 and 224.

Sloped parts 262 and 264 having slopes 262-1 and 264-1 of predetermined tilts θ1 and θ2 are provided at the bottom 208 of the cavity 205 of the package body 210, at which the first light emitting device 222 and the second light emitting device 224 are mounted. Here, the tilts θ1 and θ2 of the respective slopes 262-1 and 264-1 are angles to the bottom 208 of the cavity 205. In this case, the sloped parts 262 and 264 may protrude from the bottom 208 of the cavity 205. For example, the sloped parts 262 and 264 may be made of the same material as the package body 210 and may be integrated with the packaged body 210.

The tilt θ1 of the first slope 262-1 of the first sloped part 262 may be greater than 0° and less than 90° (0°<θ1<90°). Also, the tilt θ2 of the second slope 264-1 of the second sloped part 264 may be greater than 0° and less than 90° (0°<θ1<90°).

The first slope 262-1 of the first sloped part 262 and the second slope 264-1 of the second sloped part 264 may be symmetric with respect to the phosphor layer 250 or at least a portion of the phosphor layer 250, to which, however, embodiments are not limited.

The first sloped part 262 and the second sloped part 264 may be symmetric with respect to a center line of the bottom 208 of the cavity 205. For example, the first sloped part 262 and the second sloped part 264 may be separated from the center line of the bottom 208 of the cavity 205 by the same distance w. Also, the first slope of the first sloped part 262 may be sloped so that the first slope of the first sloped part 262 and the second slope of the second sloped part 264 are symmetric with respect to the center line of the bottom 208 of the cavity 205.

The third conductive layer 216 may be disposed on the first slope 262-1 and the fourth conductive layer 218 may be disposed on the second slope 264-1. For example, the third conductive layer 216 and the fourth conductive layer 218 may be electrically connected to each other, to which, however, embodiments are not limited.

The first light emitting device 222 is mounted on the first slope 262-1 of the first sloped part 262 and the second light emitting device 224 is mounted on the second slope 264-1 of the second sloped part 264. For example, the first light emitting device 222 may be bonded to the third conductive layer 216 on the first slope 262-1 and the second light emitting device 224 may be bonded to the fourth conductive layer 218 on the second slope 264-1. Consequently, the first light emitting device 222 and the second light emitting device 224 may be mounted at the package body 210 so that the first light emitting device 222 and the second light emitting device 224 are, for example, at the predetermined angles θ1 and θ2 to the bottom 208 of the cavity 205. As a result, light emission surfaces of the first light emitting device 222 and the second light emitting device 224 may have predetermined tilts with respect to the bottom 208 of the cavity 205.

The first light emitting device 222 is electrically connected to the first conductive layer 212 and the third conductive layer 216. The second light emitting device 224 is electrically connected to the second conductive layer 214 and the fourth conductive layer 218. For example, the first light emitting device 222 and the second light emitting device 224 may be vertical type light emitting devices shown in FIG. 15.

In this case, the second electrode layer 505 (see FIG. 15) of the first light emitting device 222 may be electrically joined to the third conductive layer 216 and the first electrode layer 560 (see FIG. 15) of the first light emitting device 222 may be electrically connected to the first conductive layer 212 via the first wire 232. Also, the second electrode layer 505 of the second light emitting device 224 may be electrically joined to the fourth conductive layer 218 and the first electrode layer 560 of the second light emitting device 224 may be electrically connected to the second conductive layer 214 via the second wire 234.

The reflection plate 225 may be formed at the sidewall 207 of the cavity 205 of the package body 210 to direct light emitted from the first light emitting device 222 and the second light emitting device 224 in predetermined directions. The reflection plate 225 is made of a light reflective material. The reflection plate 225 may be made of, for example, a metal coating or a thin metal piece. The reflection plate 225, functioning to improve light directivity, is not necessarily needed and thus may be omitted.

The molding layer 240 surrounds the first light emitting device 222 and the second light emitting device 224 located in the cavity 205 of the package body 210 to protect the first light emitting device 222 and the second light emitting device 224 from external environment. For example, the cavity of the package body 210 may be filled with the molding layer 240 to cover the first light emitting device 222 and the second light emitting device 224. The molding layer 240 may be made of an transparent polymer resin, such as epoxy or silicon.

The phosphor layer 250 is located in the molding layer 240 between the first light emitting device 222 and the second light emitting device 224 to change the wavelength of light emitted from the first light emitting device 222 and the second light emitting device 224. The phosphor layer 250 extends upward from the bottom 208 of the cavity 205 of the package body 210 in the molding layer 240. For example, the phosphor layer 250 may be formed by mixing a resin layer with phosphor powder. The phosphor powder may include at least one selected from among red, yellow and green phosphor powder.

Figure 10:
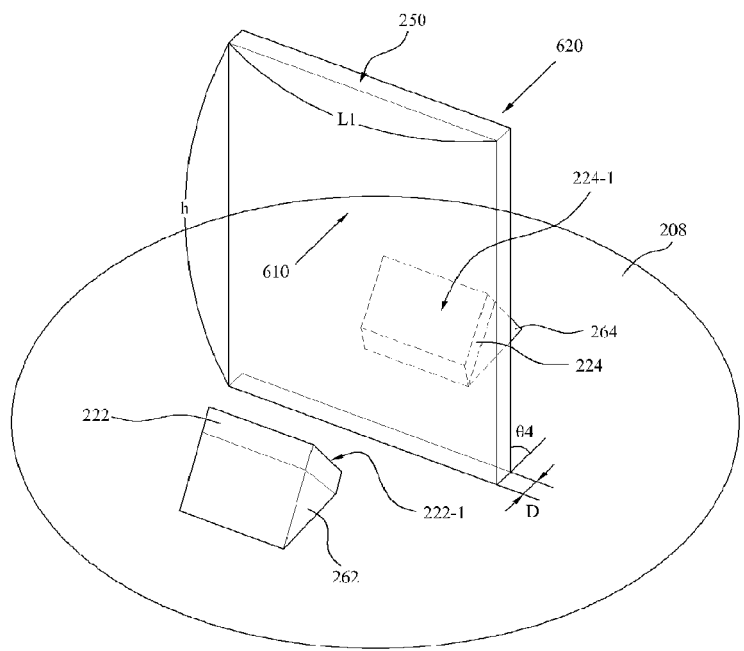
FIG. 10 is a perspective view showing a phosphor layer shown in FIG. 4.

FIG. 10 is a perspective view showing the phosphor layer 250 shown in FIG. 4. Referring to FIGS. 4 and 10, the phosphor layer 250 has a predetermined tilt θ3 with respect to the bottom 208 of the cavity 205 of the package body 210 in the molding layer 240 between the first light emitting device 222 and the second light emitting device 224.

The phosphor layer 250 has a first light incidence surface 610 facing the first light emitting device 222 and a second light incidence surface 620 facing the second light emitting device 224. The first light incidence surface 610 and the second light incidence surface 620 are opposite to each other. The first light incidence surface 610 and the second light incidence surface 620 may have predetermined tilts θ3 and θ4 with respect to the bottom 208 of the cavity 205 of the package body 210, respectively. The phosphor layer 250 may be made of a phosphor material having a predetermined thickness D between the first light incidence surface 610 and the second light incidence surface 620, length L1 and height h. For example, the first light incidence surface 610 and the second light incidence surface 620 may be perpendicular to the bottom 208 of the cavity 205 of the package body 210 (θ3=θ4=90°).

The first light incidence surface 610 and the second light incidence surface 620 shown in FIG. 10 are formed in a rectangular shape, to which, however, embodiments are not limited. For example, the first light incidence surface 610 and the second light incidence surface 620 may be formed in a polygonal shape, such as a square shape, a circular shape or an oval shape.

The height h of the phosphor layer 250 may be decided based on the tilt θ1 of the first slope 262-1 of the first sloped part 262 and the tilt θ2 of the second slope 264-1 of the second sloped part 264. The length L1 of the phosphor layer 250 may be greater than the width D of the phosphor layer 250, to which, however, embodiments are not limited.

The first light emitting device 222 and the second light emitting device 224 may be disposed so that the first light emitting device 222 and the second light emitting device 224 are opposite to each other around the phosphor layer 250. The first light emitting device 222 may be disposed at one side of the phosphor 250 and the second light emitting device 224 may be disposed at the other side of the phosphor layer 250. The one side is the opposite of the other side with respect to the phosphor layer 250.

For example, the first light emitting device 222 may face the first light incidence surface 610 and may be disposed on the package body 210 at one side (for example, left side) of the phosphor layer 250. Also, the second light emitting device 224 may face the second light incidence surface 620 and may be disposed on the package body 210 at the other side (for example, right side) of the phosphor layer 250.

The first light emitting device 222 and the second light emitting device 224 may be symmetric with respect to the phosphor layer 250 or at least a portion of the phosphor layer 250. For example, the first light emitting device 222 and the second light emitting device 224 may be separated from the phosphor layer 250 or at least a portion of the phosphor layer 250 by the same distance W. Also, the first light emitting device 222 and the second light emitting device 224 may tilt in symmetry with respect to the phosphor layer 250 or at least a portion of the phosphor layer 250. For example, θ1 may be equal to θ2.

Also, an angle between the a light emission surface 222-1 of the first light emitting device 222 and the first light incidence surface 610 and an angle between the a light emission surface 224-1 of the first light emitting device 224 and the second light incidence surface 620 may be symmetric with respect to the phosphor layer 250 or at least a portion of the phosphor layer 250. The phosphor layer 150 shown in FIG. 1 may have the same conditions as in FIG. 10.

Figure 11:
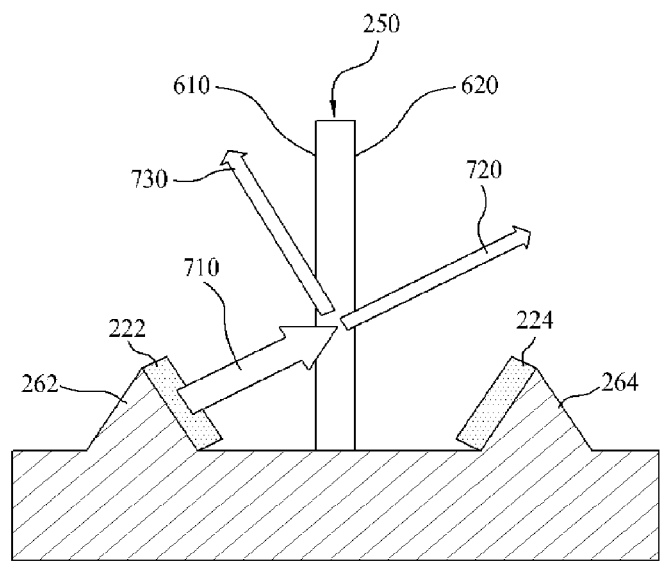
FIG. 11 is a view showing reflected light and transmitted light at the phosphor layer shown in FIG. 4.

FIG. 11 is a view showing reflected light and transmitted light at the phosphor layer 250 shown in FIG. 4. Referring to FIG. 11, first incident light 710 irradiated from the first light emitting device 222 to the first light incidence surface 610 is scattered at the phosphor layer 250. The light scattered at the phosphor layer 250 have no fixed directions and may be divided into reflected light 730 reflected by the phosphor layer 250 and transmitted light 720 transmitted through the phosphor layer 250.

Reflected light reflected by a phosphor layer of a general light emitting device package may be rereflected by a reflection plate formed at a sidewall of a cavity of a package body or may be reabsorbed by a light emitting device. Due to such rereflection or reabsorption may cause optical loss of the light emitting device package.

In this embodiment, however, the transmitted light 720 and the reflected light 730 do not travel toward the reflection plate 225 or the light emitting devices 222 and 224 since the light emitting devices 222 and 224 tilt and the phosphor layer 250 extends upward from top surface of the package body in the molding layer 240, as shown in FIG. 4.

In this embodiment, therefore, the transmitted light 720 and the reflected light 730 do not rereflected by the reflection plate 225 or reabsorbed by the light emitting devices 222 and 224. Consequently, the transmitted light 720 and the reflected light 730 are effectively extracted from the light emitting device package, thereby improving light extraction efficiency.

Figure 5:
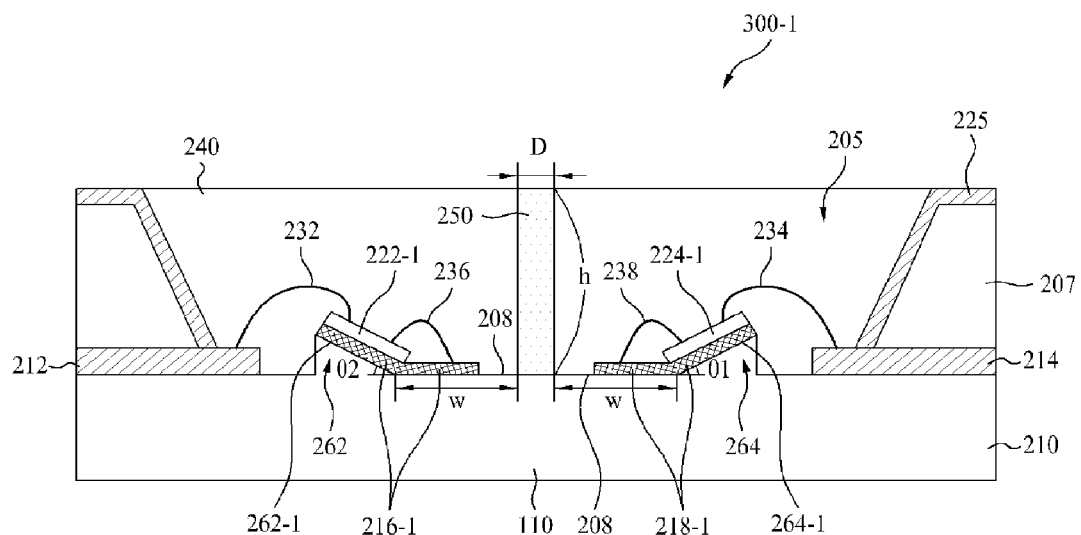
FIG. 5 is a view showing a light emitting device package according to another embodiment.

FIG. 5 is a view showing a light emitting device package 300-1 according to another embodiment. Parts of FIG. 5 identical to those of FIG. 4 are denoted by the same reference numerals and a description thereof will thus be omitted or briefly described.

Referring to FIG. 5, the light emitting device package 300-1 may include the same horizontal type light emitting devices 222-1 and 224-1 as ones shown in FIG. 14.

A third conductive layer 216-1 may be disposed on a first slope 262-1 and a region of a bottom 208 of a cavity 205, and a fourth conductive layer 218-1 may be disposed on a second slope 264-1 and another region of the bottom 208 of the cavity 205. In this case, the third conductive layer 216-1 and the fourth conductive layer 218-1 may be electrically connected to each other, to which, however, embodiments are not limited.

The first light emitting device 222-1 may be disposed on the third conductive layer 216-1 located on the first slope 262-1 and the second light emitting device 224-1 may be disposed on the fourth conductive layer 218-1 located on the second slope 264-1.

Also, a first electrode 432 of the first light emitting device 222-1 may be electrically connected to a first conductive layer 212 via a first wire 232 and a second electrode 434 of the first light emitting device 222-1 may be electrically connected to the third conductive layer 216-1 located at a region of the bottom 208 of the cavity 205 via a third wire 236.

Also, a first electrode 432 of the second light emitting device 224-1 may be electrically connected to a second conductive layer 214 via a second wire 234 and a second electrode 434 of the second light emitting device 224-1 may be electrically connected to the fourth conductive layer 218-1 located at another region of the bottom 208 of the cavity 205 via a fourth wire 238.

Figure 6:
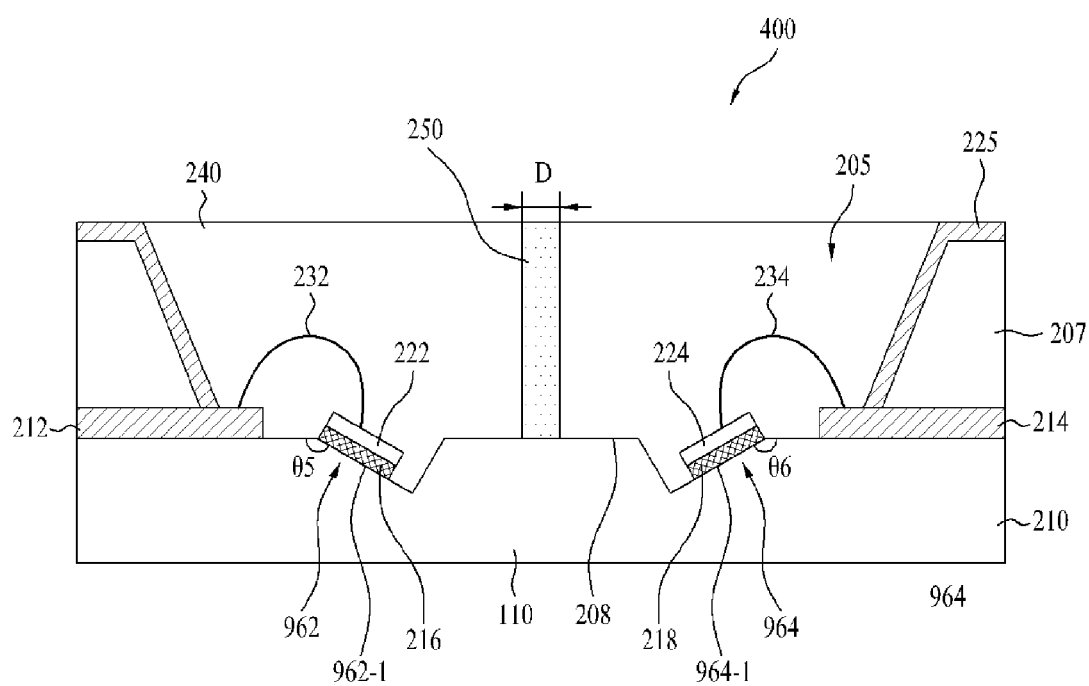
FIG. 6 is a view showing a light emitting device package according to another embodiment.

FIG. 6 is a view showing a light emitting device package 400 according to another embodiment. Parts of FIG. 6 identical to those of FIG. 4 are denoted by the same reference numerals and a description thereof will thus be omitted or briefly described.

Referring to FIG. 6, the light emitting device package 400 has a first sloped part 962 and a second sloped part 964 depressed in a bottom 208 of a cavity 205 of a package body 210. The first sloped part 962 may have a first slope 962-1 of a predetermined tilt θ5 with respect to the bottom 208 of the cavity 205. Also, the second sloped part 964 may have a second slope 964-1 of a predetermined tilt θ6 with respect to the bottom 208 of the cavity 205.

A third conductive layer 216 may be disposed on the first slope 962-1 facing a phosphor layer 250 and a fourth conductive layer 219 may be disposed on the second slope 964-1 facing the phosphor layer 250. A first light emitting device 222 may be disposed on the third conductive layer 216 and a second light emitting device 224 may be disposed on the fourth conductive layer 218.

The light emitting device package 400 shown in FIG. 6 may be identical to the light emitting device package 300 shown in FIG. 4 except that the first sloped part 962 and the second sloped part 964 are depressed in the bottom 208 of the cavity 205. For example, the first sloped part 962 and the second sloped part 964 may be symmetric with respect to the phosphor layer 250.

Figure 7:
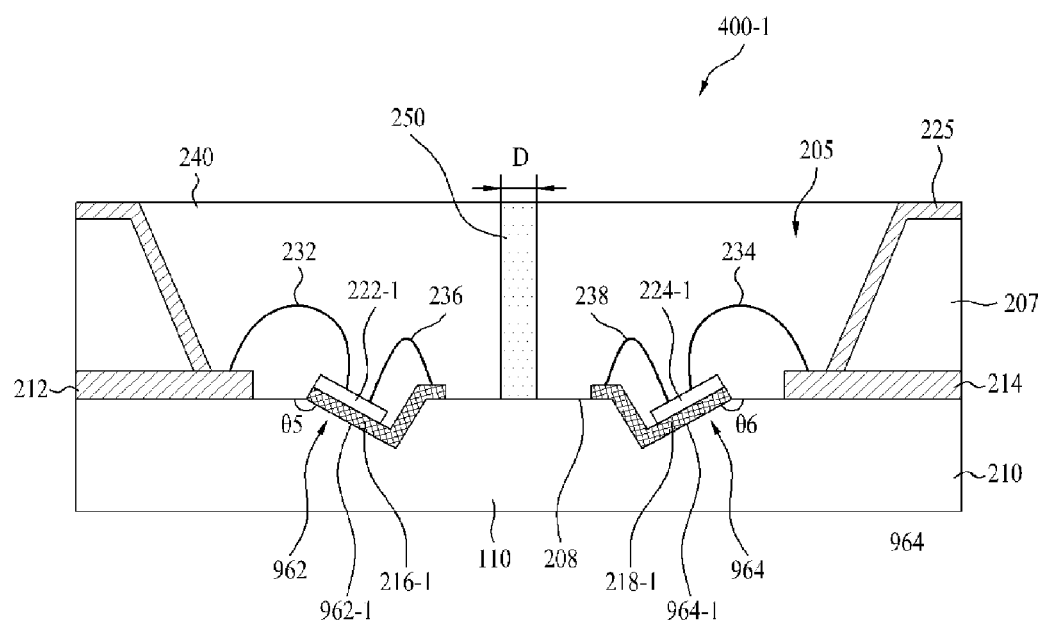
FIG. 7 is a view showing a light emitting device package according to another embodiment.

FIG. 7 is a view showing a light emitting device package 400-1 according to another embodiment. Parts of FIG. 7 identical to those of FIG. 6 are denoted by the same reference numerals and a description thereof will thus be omitted or briefly described.

The light emitting device package 400-1 shown in FIG. 7 may include horizontal type light emitting devices 222-1 and 224-1 shown in FIG. 14. Consequently, the light emitting device package 400-1 shown in FIG. 7 may be identical to the light emitting device package 400 shown in FIG. 6 except structures of a third conductive layer 216-1 and a fourth conducive layer 218-1 and connections of wires 236 and 238.

A third conductive layer 216-1 may be disposed on a first slope 962-1 and a region of a bottom 208 of a cavity 205 contacting the first slope 962-1, and a fourth conductive layer 218-1 may be disposed on a second slope 964-1 and another region of the bottom 208 of the cavity 205 contacting the second slope 964-1. The first light emitting device 222-1 may be disposed on the third conductive layer 216-1 located on the first slope 962-1 and the second light emitting device 224-1 may be disposed on the fourth conductive layer 218-1 located on the second slope 964-1.

A first electrode 432 of the first light emitting device 222-1 may be electrically connected to a first conductive layer 212 via a first wire 232 and a second electrode 434 of the first light emitting device 222-1 may be electrically connected to the third conductive layer 216-1 located at a region of the bottom 208 of the cavity 205 via a third wire 236.

Also, a first electrode 432 of the second light emitting device 224-1 may be electrically connected to a second conductive layer 214 via a second wire 234 and a second electrode 434 of the second light emitting device 224-1 may be electrically connected to the fourth conductive layer 218-1 located at another region of the bottom 208 of the cavity 205 via a fourth wire 238.

Figure 8:
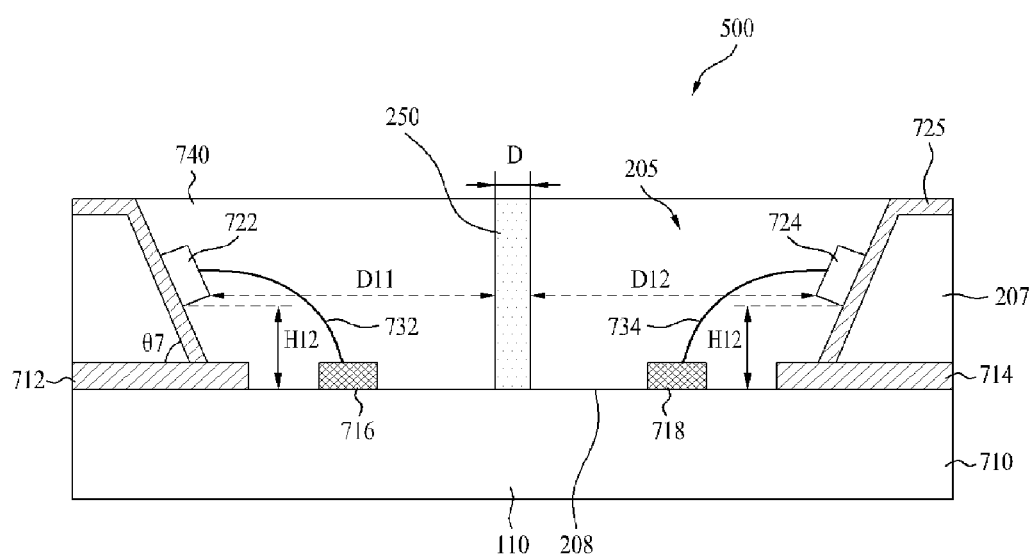
FIG. 8 is a view showing a light emitting device package according to another embodiment.

FIG. 8 is a view showing a light emitting device package 500 according to another embodiment. Referring to FIG. 8, the light emitting device package 500 includes a package body 710, a first conductive layer 712, a second conductive layer 714, a third conductive layer 716, a fourth conductive layer 718, a first light emitting device 722, a second light emitting device 724, a reflection plate 725, a first wire 732, a second wire 734, a molding layer 740 and a phosphor layer 250.

The package body 710 is provided at a region thereof with a cavity 205 having a sidewall 207 and a bottom 208. The sidewall 207 of the cavity 205 may be sloped at a predetermined tilt θ7 with respect to the bottom 208. For example, the tilt θ7 of the sidewall 207 of the cavity 205 may be greater than 0° and less than 90°.

The first to fourth conductive layers 712 to 718 may be disposed at the surface of the package body 710 so as to be electrically separated from each other in consideration of heat dissipation or installation of the light emitting devices 722 and 724.

Alternatively, the first conductive layer 712 and the second conductive layer 714 may be electrically connected to each other, the third conductive layer 716 and the fourth conductive layer 718 may be electrically connected to each other, and the first conductive layer 712 and the third conductive layer 716 may be electrically separated from each other.

The reflection plate 725 may be formed at the sidewall 207 of the cavity 205 of the package body 710 to direct light emitted from the first light emitting device 722 and the second light emitting device 724 in predetermined directions. The reflection plate 725 is made of a light reflective material. For example, the reflection plate 725 may be made of a conductive material such as a metal coating or a thin metal piece. The reflection plate 725, functioning to improve light directivity, is not necessarily needed and thus may be omitted.

The first light emitting device 722 is disposed on the reflection plate 725 of the sidewall 207 of the cavity 205 so as to be electrically connected to the first conductive layer 712 and the third conductive layer 716. Also, the second light emitting device 724 is disposed on the reflection plate 725 of the sidewall 207 of the cavity 205 so as to be electrically connected to the second conductive layer 714 and the fourth conductive layer 718.

The reflection plate 725 may be electrically connected to the first conductive layer 712 and the second conductive layer 714. Also, the first light emitting device 722 and the second light emitting device 724 may be bonded to the reflection plate 725, the first light emitting device 722 may be electrically connected to the third conductive layer 716 via the first wire 732, and the second light emitting device 724 may be electrically connected to the fourth conductive layer 718 via the second wire 734.

For example, the first light emitting device 722 and the second light emitting device 724 may be identical to the light emitting devices shown in FIG. 15. In this case, a second electrode layer 505 of the first light emitting device 722 may be bonded to the reflection plate 725 so as to be electrically connected to the reflection plate 725 and a first electrode 560 of the first light emitting device 722 may be electrically connected to the third conductive layer 716 via the first wire 732.

Also, a second electrode layer 505 of the second light emitting device 724 may be bonded to the reflection plate 725 so as to be electrically connected to the reflection plate 725 and a first electrode 560 of the second light emitting device 724 may be electrically connected to the fourth conductive layer 718 via the second wire 734.

If the reflection plate 725 is omitted, the first light emitting device 722 and the second light emitting device 724 may be disposed on the sidewall 207 of the cavity 205, a first bonding layer (not shown) electrically connected to the first conductive layer 712 and a second bonding layer (not shown) electrically connected to the second conductive layer 714 may be provided on the sidewall 207 of the cavity 205, the first light emitting device 722 may be bonded to the first bonding layer, and the second light emitting device 724 may be bonded to the second bonding layer.

The molding layer 740 surrounds the first light emitting device 722 and the second light emitting device 724 disposed on the sidewall 207 of the cavity 205 of the package body 710.

The phosphor layer 250 is located in the molding layer 740 between the first light emitting device 722 and the second light emitting device 724 to change the wavelength of light emitted from the first light emitting device 722 and the second light emitting device 724. The phosphor layer 250 extends upward from the bottom 208 of the cavity 205 of the package body 710 in the molding layer 740. For example, the phosphor layer 250 may be made of a phosphor material having a predetermined thickness D and may be perpendicular to the bottom 208 of the cavity 205 of the package body 710.

The sidewall 207 of the cavity 205 of the package body 710 may be symmetric with respect to the phosphor layer 250 or at least a portion of the phosphor layer 250, to which, however, embodiments are not limited. The first light emitting device 722 and the second light emitting device 724 may be disposed on the sidewall 207 of the cavity 205 so as to be symmetric with respect to the phosphor layer 250 or at least a portion of the phosphor layer 250. For example, a distance D11 from the phosphor layer 250 to the first light emitting device 722 may be equal to a distance D12 from the phosphor layer 250 to the second light emitting device 724. Also, a distance H11 from the bottom 208 of the cavity 205 to the first light emitting device 722 may be equal to a distance H12 from the bottom 208 of the cavity 205 to the second light emitting device 724.

Figure 9:
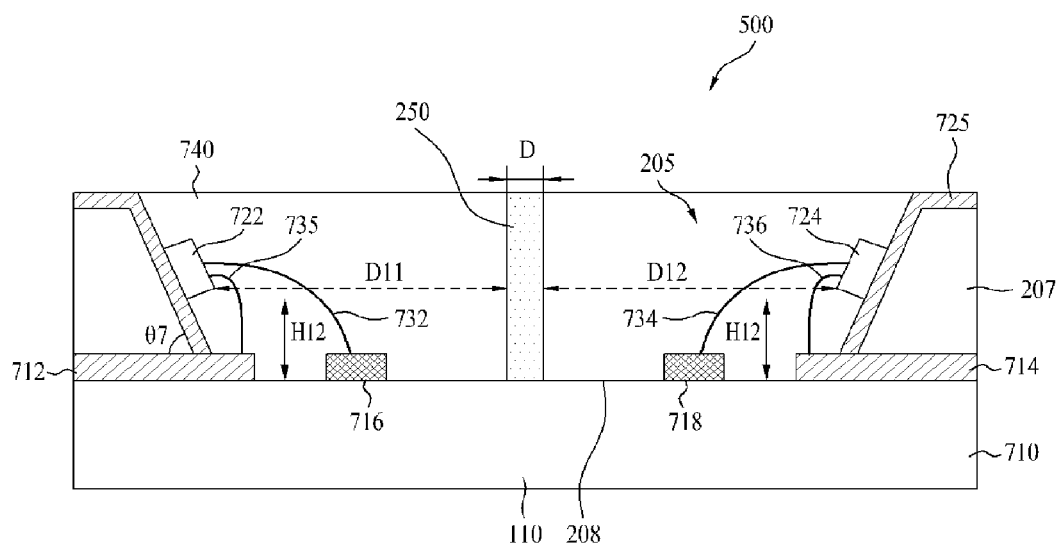
FIG. 9 is a view showing a light emitting device package according to a further embodiment.

FIG. 9 is a view showing a light emitting device package 500-1 according to another embodiment. Parts of FIG. 9 identical to those of FIG. 8 are denoted by the same reference numerals and a description thereof will thus be omitted or briefly described.

Referring to FIG. 9, the light emitting device package 500-1 may include the same horizontal type light emitting devices as ones shown in FIG. 14.

A first light emitting device 722 and a second light emitting device 724 are disposed on a reflection plate 725 so as to be separated from each other. A first electrode 432 of the first light emitting device 722 may be electrically connected to a third conductive layer 716 via a first wire 732 and a second electrode 434 of the first light emitting device 722 may be electrically connected to a first conductive layer 712 via a third wire 735.

Also, a first electrode 432 of the second light emitting device 724 may be electrically connected to a fourth conductive layer 718 via a second wire 734 and a second electrode 434 of the second light emitting device 724 may be electrically connected to a second conductive layer 714 via a fourth wire 736.

Figure 12:
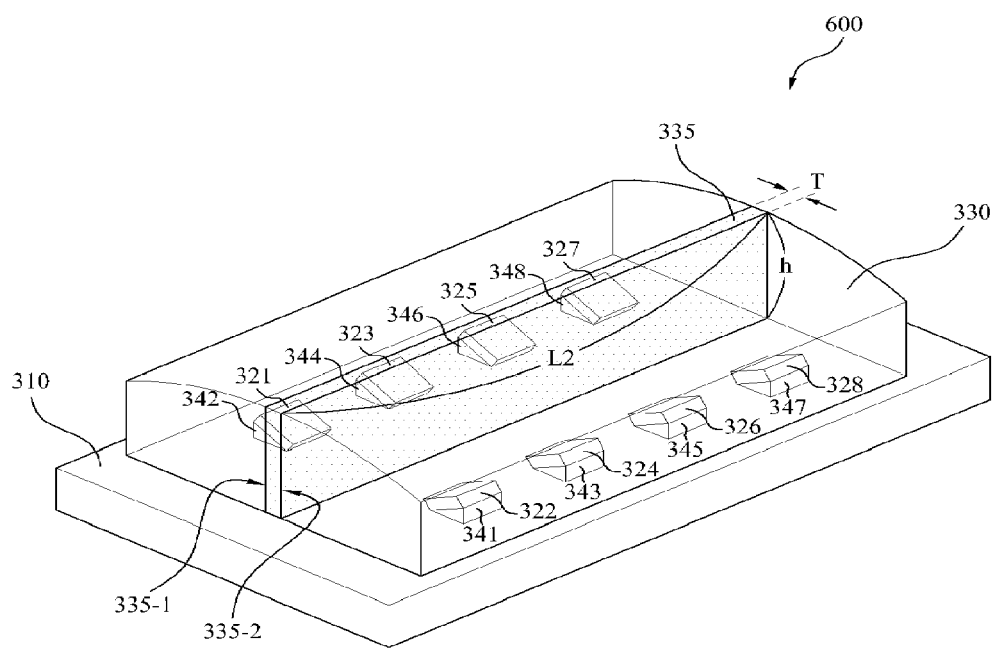
FIG. 12 is a view showing a light emitting module according to an embodiment.

FIG. 12 is a view showing a light emitting module 600 according to an embodiment. Referring to FIG. 12, the light emitting module 600 includes a board 310, first light emitting devices 321, 323, 325 and 327 (hereinafter, referred to as 321 to 327), second light emitting devices 322, 324, 326 and 328 (hereinafter, referred to as 322 to 328), a molding layer 330 and a phosphor layer 335. For example, the light emitting module 600 shown in FIG. 12 may be of a chip on board (COB) type.

Referring to FIG. 12, the board 310 may be a printed circuit board and the first light emitting devices 321 to 327 and the second light emitting devices 322 to 328 may be light emitting device (LED) chips shown in FIG. 14 or 15, which will be described below.

The first light emitting devices 321 to 327 and the second light emitting devices 322 to 328 are disposed on the board 310. The board 310 is provided with first sloped parts 342, 344, 346 and 348 (hereinafter, referred to as 342 to 348) and second sloped parts 341, 343, 345 and 347 (hereinafter, referred to as 341 to 347) on which the first light emitting devices 321 to 327 and the second light emitting devices 322 to 328 are disposed. As shown in FIG. 9, the first sloped parts 342 to 348 and the second sloped parts 341 to 347 may be protrude from the board 310.

The first sloped parts 342 to 348 may be separated from each other. For example, the first sloped parts 342 to 348 may be disposed on the board 310 in a line so that the first sloped parts 342 to 348 are separated from each other and the second sloped parts 341 to 347 may be disposed on the board 310 in a line so that the second sloped parts 341 to 347 are separated from each other so as to correspond to the first sloped parts 342 to 348.

The first light emitting devices 321 to 327 are disposed at the first sloped parts 342 to 348 and the second light emitting devices 322 to 328 are disposed at the second sloped parts 341 to 347.

The first sloped parts 342 to 348 and the second sloped parts 341 to 347 have slopes of predetermined tilts with respect to the board 310. Here, the tilts of the slopes are angles at which the slopes tilt with respect to the surface of the board 310.

For example, the tilts of the first slopes of the first sloped parts 342 to 348 may be greater than 0° and less than 90°. Also, the tilts of the first slopes of the first sloped parts 342 to 348 may be the same, to which, however, embodiments are not limited.

The tilts of the second slopes of the second sloped parts 341 to 347 may be greater than 0° and less than 90°. Also, the tilts of the second slopes of the second sloped parts 341 to 347 may be the same, to which, however, embodiments are not limited.

For example, each of the first light emitting devices 321 to 327 may be disposed on a corresponding one of the first slopes of the first sloped parts 342 to 348 and each of the second light emitting devices 322 to 328 may be disposed on a corresponding one of the second slopes of the second sloped parts 341 to 347.

The first light emitting devices 321 to 327 disposed at the first sloped parts 342 to 348 and the second light emitting devices 322 to 328 disposed at the second sloped parts 341 to 347 may be symmetric.

The molding layer 330 surrounds the first light emitting devices 321 to 327 disposed on the first sloped parts 342 to 348 and the second light emitting devices 322 to 328 disposed on the second sloped parts 341 to 347. For example, the molding layer 330 may be disposed to simultaneously surround the first light emitting devices 321 to 327, the second light emitting devices 322 to 328 and a region of the board located between the first light emitting devices 321 to 327 and the second light emitting devices 322 to 328. The molding layer 330 may be made of an achromatic transparent polymer resin, such as epoxy or silicon.

The phosphor layer 335 is located in the molding layer 330 between the first light emitting devices 321 to 327 and the second light emitting devices 322 to 328 to change the wavelength of light emitted from the first light emitting devices 321 to 327 and the second light emitting devices 322 to 328. The phosphor layer 335 extends upward from the top surface of the board 310 in the molding layer 330. Namely, the phosphor layer 335 tilts with respect to the surface of the board 310 in the molding layer 330.

The phosphor layer 335 has a first light incidence surface 335-1 facing the first light emitting devices 321 to 327 and a second light incidence surface 335-2 facing the second light emitting devices 322 to 328. The phosphor layer 335 may be made of a phosphor material having a predetermined width T between the first light incidence surface 335-1 and the second light incidence surface 335-2, length L2 and height H. The first light incidence surface 335-1 and the second light incidence surface 335-2 may face each other and may be perpendicular to the board 310.

The phosphor layer 335 may overlap with at least one of the first light emitting devices 321 to 327 and the second light emitting devices 322 to 328 in a direction (hereinafter, referred to as a 'first direction') from the first light emitting devices 321 to 327 to the second light emitting devices 322 to 328, For example, one (for example, the first light emitting device 321) of the first light emitting devices 321 to 327 and the second light emitting device 322 corresponding thereto may overlap with the phosphor layer 335 in the first direction.

The first light emitting devices 321 to 327 and the second light emitting devices 322 to 328 may be opposite to each other around the phosphor layer 335. The first light emitting devices 321 to 327 may be disposed at one side of the phosphor 335 and the second light emitting devices 322 to 328 may be disposed at the other side of the phosphor layer 335. The one side is the opposite of the other side with respect to the phosphor layer 335.

For example, the first light emitting devices 321 to 327 may face the first light incidence surface 335-1 and may be disposed on the board 310 at one side (for example, left side) of the phosphor layer 335. Also, the second light emitting devices 322 to 328 may face the second light incidence surface 335-2 and may be disposed on the board 310 at the other side (for example, right side) of the phosphor layer 335.

The first light emitting devices 321 to 327 and the second light emitting devices 322 to 328 may be symmetric with respect to the phosphor layer 335. For example, the first light emitting devices 321 to 327 and the second light emitting devices 322 to 328 may be symmetric with respect to the first light incidence surface 335-1 and the second light incidence surface 335-2, respectively.

For example, the first light emitting devices 321 to 327 and the second light emitting devices 322 to 328 may be separated from the phosphor layer 335 or at least a portion of the phosphor layer 335 by the same distance. Also, the first light emitting devices 321 to 327 and the second light emitting devices 322 to 328 may be mounted on the first sloped parts 342 to 348 and the second sloped parts 341 to 347 tilted in symmetry with respect to the phosphor layer 335 or at least a portion of the phosphor layer 335.

Namely, the first sloped parts 342 to 348 and the second sloped parts 341 to 347 may be separated from the phosphor layer 335 or at least a portion of the phosphor layer 335 by the same distance. Also, the slopes of the first sloped parts 342 to 348 and the slopes of the second sloped parts 341 to 347 may be symmetric with respect to the phosphor layer 335 or at least a portion of the phosphor layer 335. Consequently, the first light emitting devices 321 to 327 disposed on the first sloped parts 342 to 348 and the second light emitting devices 322 to 328 disposed on the second sloped parts 341 to 347 may tilt in symmetry.

As described above, the light emitting module 600 according to this embodiment has a structure to effectively extract light reflected by or transmitted through the phosphor layer 335 from the light emitting module 600, thereby improving light extraction efficiency of the light emitting module 600.

Figure 13:
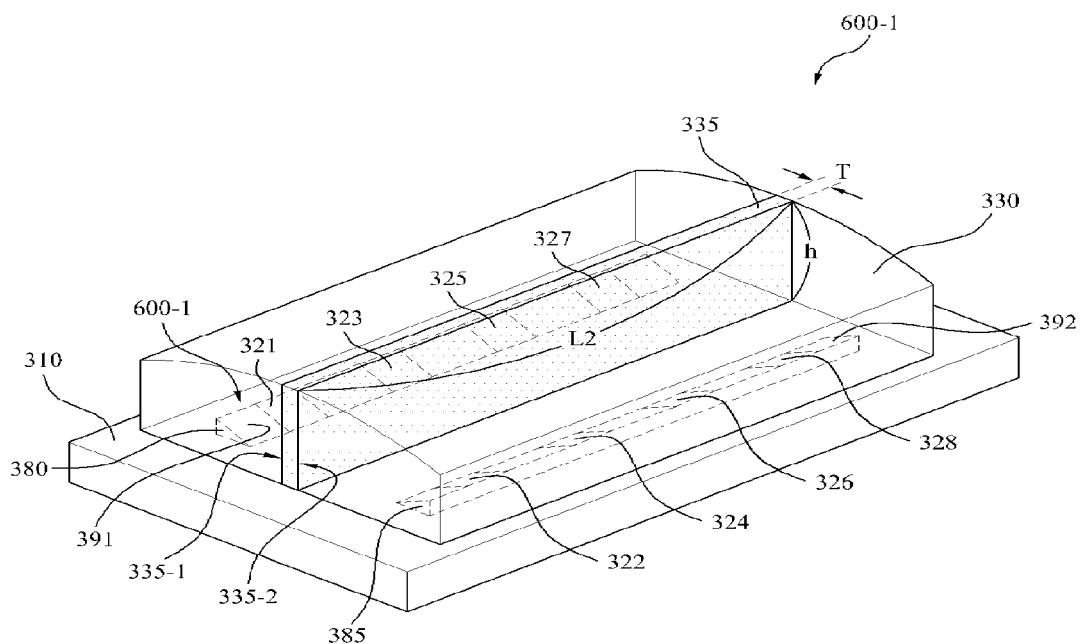
FIG. 13 is a view showing a light emitting module according to another embodiment.

FIG. 13 is a view showing a light emitting module 600-1 according to another embodiment. Parts of FIG. 13 identical to those of FIG. 1 are denoted by the same reference numerals and a description thereof will thus be omitted or briefly described.

Referring to FIG. 13, the light emitting module 600-1 includes a board 310, a first sloped part 380, a second sloped part 385, first light emitting devices 321 to 327, second light emitting devices 322 to 328, a molding layer 330 and a phosphor layer 335.

The first sloped part 380 and the second sloped part 385 are disposed on the board 310 so as to be separated from each other. The first sloped part 380 may have an integrated first slope 391 of a predetermined tilt with respect to the board 310 and the second sloped part 385 may have an integrated second slope 392 of a predetermined tilt with respect to the board 310.

The first light emitting devices 321 to 327 may be disposed on the first slope 391 so as to be separated from each other. The second light emitting devices 322 to 328 may be disposed on the second slope 392 so as to be separated from each other. Also, the first slope 391 and the second slope 392 may be symmetric with respect to the phosphor layer 335. For example, the first slope 391 and the second slope 392 may be separated from the phosphor layer 335 by the same distance and may have the same tilt.

Embodiments may be realized as a display apparatus, an indication apparatus or a lighting system including the aforementioned light emitting device package 100, 200, 300, 400 or 500 or the light emitting module 600. For example, the lighting system may include a lamp or a streetlight.

Figure 16:
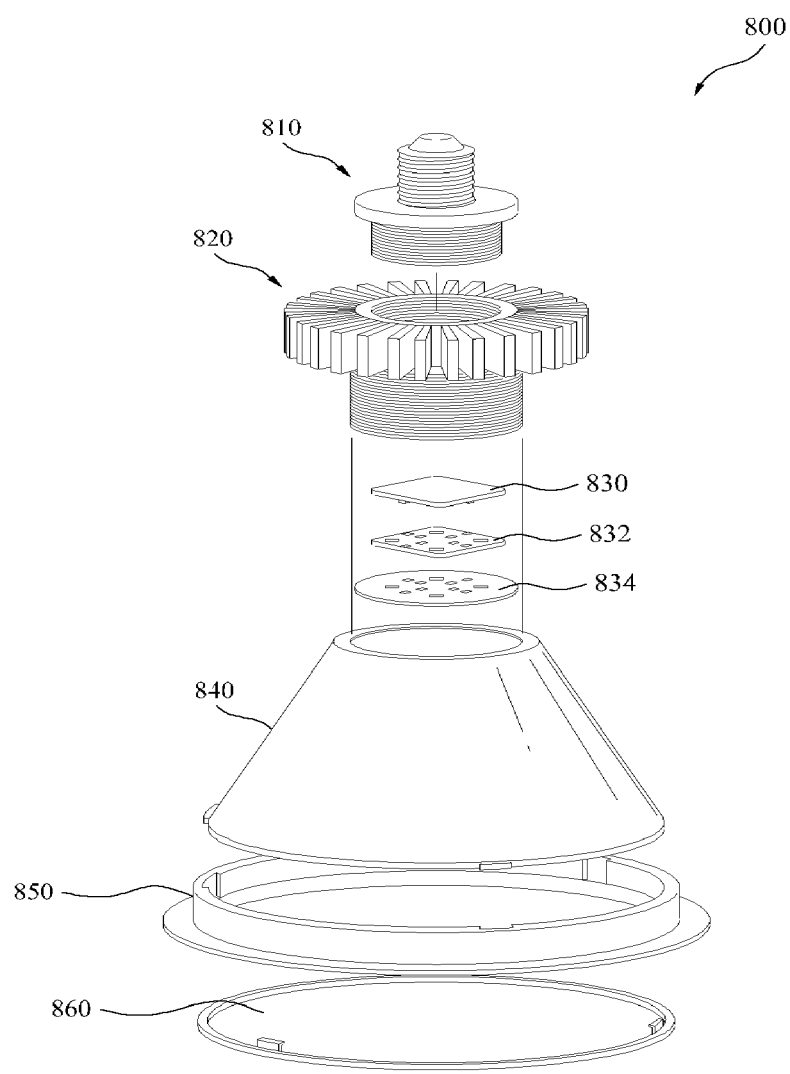
FIG. 16 is a view showing a lighting apparatus including a light emitting module according to an embodiment.

FIG. 16 is a view showing a lighting apparatus 800 including a light emitting module according to an embodiment. Referring to FIG. 16, the lighting apparatus 800 includes a power coupler 810, a heat sink 820, a light emitting module 830, a reflector 840, a cover cap 850 and a lens 860.

The power coupler 810 is formed in the shape of a screw, the upper end of which is inserted into an external power socket (not shown). The power coupler 810 is inserted into the external power socket to supply power to the light emitting module 830. The heat sink 820 discharges heat generated from the light emitting module 830 through heat sink fins formed at the lateral surface thereof. The heat sink is connected to the power coupler. For example, the upper end of the heat sink 820 is screw-coupled with the lower end of the power coupler 810.

The light emitting module 830 is fixed to the bottom of the heat sink 820. In this case, the light emitting module 830 may include a board and light emitting device packages disposed on the board.

The light emitting module 830 may be the light emitting module 600 or 600-1 shown in FIG. 12 or 13. Also, each of the light emitting device packages included in the light emitting module 830 may be any one of the embodiments 100, 200, 300, 300-1, 400, 400-1, 500 and 500-1.

The lighting apparatus 800 may further include an insulative sheet 832 or a reflective sheet 834 disposed under the light emitting module 830 to electrical protect the light emitting module 830. Also, an optical member to perform various optical functions may be disposed on a route along which light irradiated from the light emitting module 830 travels.

The reflector 840 is truncated conical and is connected to the lower end of the heat sink 820 to reflect light irradiated from the light emitting module 830. The cover cap 850 is formed of a circular ring shape and is coupled to the lower end of the reflector 840. The lens 860 is fitted in the cover cap 850. The lighting apparatus 800 shown in FIG. 16 may be built in the ceiling or wall of a building to be used as downlight.

Figure 17:
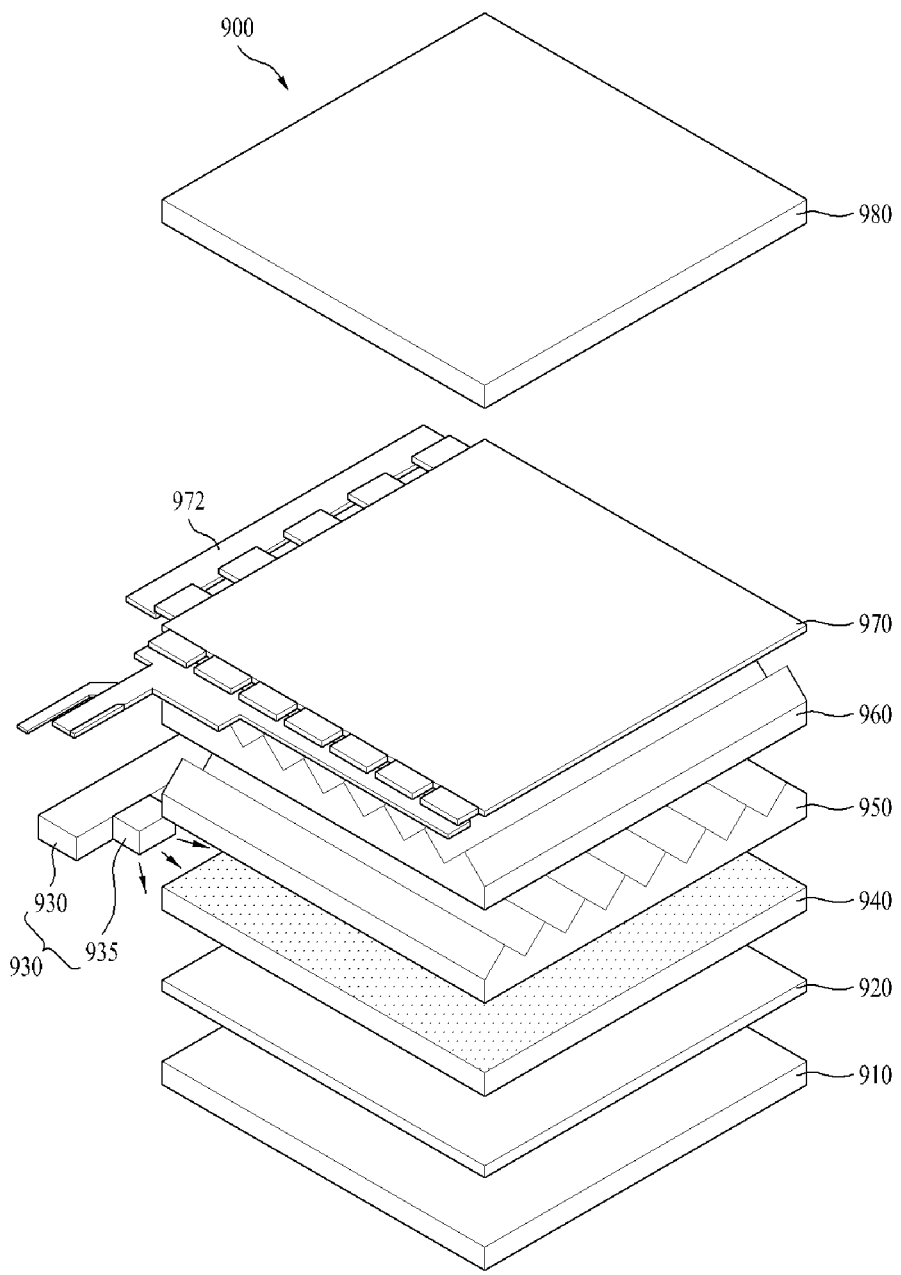
FIG. 17 is a view showing a display apparatus including a light emitting device package according to an embodiment.

FIG. 17 is a view showing a display apparatus 900 including a light emitting device package according to an embodiment.

Referring to FIG. 17, the display apparatus 900 may include a light source module 930, a reflection plate 920 disposed on a bottom cover 910, a light guide plate 940 disposed in front of the reflection plate 920 to guide light emitted from the light source module 930 to the front of the display apparatus, an optical sheet including prism sheets 950 and 960 disposed in front of the light guide plate 940, a panel 970 disposed in front of the prism sheets 950 and 960 and a color filter 980 disposed in front of the panel 970. Here, the bottom cover 910, the reflection plate 920, the light source module 930, the light guide plate 940 and the optical sheet may constitute a backlight unit.

The light source module 930 includes a light emitting device package 935 on a board 932. Here, the board 932 may be a PCB and the light emitting device package 935 may be one of the embodiments 100, 200, 300, 300-1, 400, 400-1, 500 and 500-1.

Elements of the display apparatus 900 are received in the bottom cover 910. In this embodiment, the reflection plate 920 is a separate element as shown in the drawing. Alternatively, the rear surface of the light guide plate 940 or the front surface of the bottom cover 910 may be coated with a material exhibiting high reflectance to form the reflection plate 920.

Here, the reflection plate 920 may be made of a material exhibiting high reflectance and that can be formed in a foil shape. For example, the reflection plate 920 may be made of polyethylene terephthalate (PET).

The light guide plate 940 scatters light emitted from the light source module so that the light can be uniformly distributed throughout the entire region of a screen of a liquid crystal display apparatus. Consequently, the light guide plate 940 is made of a material exhibiting high refractive index and transmissivity. For example, the light guide plate 940 may be made of polymethylmethacrylate (PMMA), polycarbonate (PC) or polyethylene (PE).

The first prism sheet 950, made of a polymer material exhibiting high transmissivity and elasticity, may be formed at one surface of a support film. Polymer may have a prism layer in which a plurality of three-dimensional structures is repeatedly formed. Here, a plurality patterns may be formed to have a stripe structure in which ridges and valleys are alternately repeated as shown in the drawing.

The direction in which ridges and valleys are formed at the second prism sheet 960 at one surface of a support film may be perpendicular to the direction in which the ridges and valleys are formed at the first prism sheet 950 at one surface of the support film so that light from the light source module and the reflection plate can be uniformly distributed to the front of the panel 970.

Although not shown, a protective sheet may be provided on each of the prism sheets. Each of the support films may be provided at opposite surfaces thereof with protective layers containing optical diffusion particles and a binder. Also, the prism layer may be made of a polymer material selected from a group consisting of polyurethane, styrenebutadiene copolymer, polyacrylate, polymetacrylate, polymethymethacrylate, polyethylene terephthalate elastomer, polyisoprene and polysilicone.

Although not shown, a diffusion sheet may be disposed between the light guide plate 940 and the first prism sheet 950. The diffusion sheet may be made of polyester or polycarbonate-based material. The diffusion sheet refracts and scatters light incident from the backlight unit to maximally increase light incidence angle. The diffusion sheet may include a support layer containing a light dispersing agent and a first layer and a second layer formed at a light emission surface (toward the first prism sheet) and a light incidence surface (toward the reflective sheet), the first layer and the second layer containing no light dispersing agent.

In this embodiment, the diffusion sheet, the first prism sheet 950 and the second prism sheet 960 constitute the optical sheet. Alternatively, the optical sheet may be constituted by other combinations, such as a micro lens array, a combination of a diffusion sheet and a micro lens array or a combination of a prism sheet and a micro lens array.

The panel 970 may be a liquid crystal display panel. A different kind of display apparatus requiring a light source may be provided instead of the liquid crystal display panel 970. The panel 970 is configured so that a liquid crystal is disposed between glass bodies and a polarizing plate is disposed on each of the glass bodies to use the polarization of light. The liquid crystal exhibits characteristics of liquid and solid. The liquid crystal, which is constituted by organic molecules exhibiting fluidity like liquid, has a regular arrangement structure like a crystal. The molecule arrangement is changed by an external electric field to display a picture.

The liquid crystal display panel used in the display apparatus is of an active matrix type and uses a transistor as a switch to control voltage to be supplied to each pixel. Also, the color filter 980 is disposed in front of the panel 970 to transmit only red, green or blue light with respect to each pixel among light projected from the panel 970 to display a picture.

The display apparatus 900 according to this embodiment uses the light source module including the light emitting device package exhibiting high light extraction efficiency according to the embodiments, thereby improving light extraction efficiency of the display apparatus.

As is apparent from the above description, the light emitting device package and the light emitting module according to the embodiments have the effect of improving light extraction efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a package body provided at a region with a cavity having a sidewall and a bottom, wherein the bottom has a first sloped part having a first slope, a second sloped part having a second slope, and a flat part between the first sloped part and the second sloped part;
a first light emitting diode disposed on the first sloped part and a second light emitting diode disposed on the second sloped part;
a molding layer surrounding the first light emitting diode and the second light emitting diode, wherein the cavity is filled with the molding layer; and
a phosphor layer located in the molding layer between the first sloped part and the second sloped part, wherein the phosphor layer extends upward from the flat part of the bottom of the cavity and is substantially perpendicular to the flat part of the bottom of the cavity,
wherein
the first sloped part and the second sloped part are disposed at opposite sides with respect to the phosphor layer,
the phosphor layer has a first light incidence surface facing the first light emitting diode and a second incidence surface facing the second light emitting diode,
a first angle between the first light incident surface of the phosphor layer and a top surface of the first light emitting diode and a second angle between the second light incident surface of the phosphor layer and a top surface of the second light emitting diode are acute angles, and
the first sloped part and the second sloped part protrude from the bottom of the cavity,
wherein the phosphor layer has a bottom surface and a top surface, and the bottom surface of the phosphor layer is disposed on a position lower than the top surface of the first light emitting diode, and
wherein the first sloped part and the second sloped part are apart from the sidewall of the cavity.

2. The light emitting device package according to claim 1, wherein the first sloped part and the second sloped part are made of the same material as the package body and integrated with the packaged body.

3. The light emitting device package according to claim 1, wherein the first light emitting diode and the second light emitting diode are symmetric with respect to at least a portion of the phosphor layer.

4. The light emitting device package according to claim 1, further comprising:
   a first conductive layer disposed between the first slope and the first light emitting diode; and
   a second conductive layer disposed between the second slope and the second light emitting diode.

5. The light emitting device package according to claim 1, wherein
   the sidewall of the cavity is sloped at a predetermined tilt with respect to the flat part of the bottom of the cavity.

6. The light emitting device package according to claim 5, further comprising a reflection layer disposed between the sidewall of the cavity and the first light emitting diode.

7. A light emitting module, comprising:
   a printed circuit board;
   first sloped parts and second sloped parts disposed on the printed circuit board, wherein the first sloped parts and the second sloped parts protrude from the printed circuit board;
   first light emitting diodes disposed on the first sloped parts;
   second light emitting diodes disposed on the second sloped parts, wherein the second light emitting diodes are opposite to the first light emitting diodes;
   a molding layer disposed on the printed circuit board to surround the first light emitting diodes and the second light emitting diodes; and
   a phosphor layer provided in the molding layer wherein the phosphor layer extends upward from a top surface of the printed circuit board and is substantially perpendicular to the top surface of the printed circuit board,
   wherein
      the first sloped parts and the second sloped parts are disposed at opposite sides with respect to the phosphor layer,
      the phosphor layer has a first light incidence surface facing the first light emitting diodes and a second light incidence surface facing the second light emitting diodes, and
      a first angle between the first light incident surface and top surfaces of the first light emitting diodes and a second angle between the second light incident surface and top surfaces of the second light emitting diodes are acute angles,
   wherein the first sloped parts and second sloped parts are apart from an outer surface of the molding layer, and
   wherein a height of an upper surface of the phosphor layer is higher than heights of sidewalls of the molding layer.

8. The light emitting module according to claim 7, wherein the first light emitting diodes and the second light emitting diodes are symmetric with respect to at least a portion of the phosphor layer.

9. The light emitting module according to claim 7, wherein the molding layer is disposed to simultaneously surround the first light emitting diodes, the second light emitting diodes and a region of the printed circuit board located between the first light emitting diodes and the second light emitting diodes.

10. A lighting apparatus, comprising:
   a power coupler to supply power;
   a heat sink connected to the power coupler;
   a light emitting module fixed to the heat sink; and
   a reflector connected to a lower end of the heat sink to reflect light emitted from the light emitting module,
   wherein the light emitting module comprises:
      a printed circuit board;
      first sloped parts and second sloped parts disposed on the printed circuit board, wherein the first sloped parts and the second sloped parts protrude from the printed circuit board;
      first light emitting diodes disposed on the first sloped parts;
      second light emitting diodes disposed on the second sloped parts, wherein the second light emitting diodes are opposite to the first light emitting diodes;
      a molding layer disposed on the printed circuit board to surround the first light emitting diodes and the second light emitting diodes; and
      a phosphor layer provided in the molding layer wherein the phosphor layer extends upward from the printed circuit board and is substantially perpendicular to the printed circuit board,
   wherein
      the first sloped parts and the second sloped parts are disposed at opposite sides with respect to the phosphor layer,
      the phosphor layer has a first light incidence surface facing the first light emitting diodes and a second light incidence surface facing the second light emitting diodes, and
      a first angle between the first light incident surface and top surfaces of the first light emitting diodes and a second angle between the second light incident surface and top surfaces of the second light emitting diodes are acute angles, and
   wherein the phosphor layer has a bottom surface and a top surface, and the bottom surface of the phosphor layer is disposed on a position lower than the top surface of the first light emitting diodes.

11. The light emitting device package according to claim 1, wherein at least a portion of a top surface of the molding layer has a curvature.

12. The light emitting module according to claim 7, wherein at least a portion of a top surface of the molding layer has a curvature.

13. The light emitting module according to claim 7, wherein the first sloped parts and the second sloped parts are fixed to the printed circuit board, and a distance from the first light emitting diode to the phosphor layer is substantially identical to a distance from the second light emitting diode to the phosphor layer.

14. The light emitting module according to claim 7, wherein the first sloped parts and the second sloped parts are symmetric with respect to the phosphor layer.

15. The light emitting device package according to claim 1, wherein the molding layer directly contacts the first light emitting diode and the second light emitting diode, and the bottom surface of the phosphor layer directly contacts the flat part of the bottom of the cavity.

16. The light emitting module according to claim 7, wherein the first sloped parts are separated from each other in a line, and the second sloped parts are separated from each other in a line to correspond to the first sloped parts.

17. The light emitting module according to claim 7, wherein
   the first sloped parts are connected to each other and form a first single slope part and the first light emitting diodes are disposed on the first single slope part to be separated from each other, and the second sloped parts are connected to each other and form a second single slope part and the second light emitting diodes are disposed on the second single slope part to be separated from each other.

18. The light emitting device package according to claim 1, further comprising a first conductive layer disposed on the bottom of the cavity, wherein the first conductive layer is electrically coupled to the first light emitting diode, and the first sloped part is disposed between the first conductive layer and the phosphor layer.

19. The light emitting device package according to claim 18, wherein a part of a top surface of the first conductive layer is paralleled to the flat part of the bottom of the cavity, and the first conductive layer is apart from the first sloped part.

20. The light emitting device package according to claim 1, wherein a distance from the first light emitting diode to the phosphor layer is substantially identical to a distance from the second light emitting diode to the phosphor layer.

* * * * *